United States Patent
Fu et al.

(10) Patent No.: US 9,530,737 B1
(45) Date of Patent: Dec. 27, 2016

(54) SEMICONDUCTOR DEVICE AND MANUFACTURING METHOD THEREOF

(71) Applicant: TAIWAN SEMICONDUCTOR MANUFACTURING COMPANY, LTD., Hsinchu (TW)

(72) Inventors: Shih-Kang Fu, Zhongli (TW); Hsien-Chang Wu, Taichung (TW); Li-Lin Su, Taichung County (TW); Ming-Han Lee, Taipei (TW); Shau-Lin Shue, Hsinchu (TW)

(73) Assignee: TAIWAN SEMICONDUCTOR MANUFACTURING CO., LTD., Taipei (TW)

( * ) Notice: Subject to any disclaimer, the term of this patent is extended or adjusted under 35 U.S.C. 154(b) by 0 days.

(21) Appl. No.: 14/868,377

(22) Filed: Sep. 28, 2015

(51) Int. Cl.
*H01L 23/535* (2006.01)
*H01L 21/768* (2006.01)
*H01L 23/528* (2006.01)
*H01L 23/532* (2006.01)

(52) U.S. Cl.
CPC ......... *H01L 23/535* (2013.01); *H01L 21/7684* (2013.01); *H01L 21/76805* (2013.01); *H01L 21/76816* (2013.01); *H01L 21/76843* (2013.01); *H01L 21/76864* (2013.01); *H01L 21/76895* (2013.01); *H01L 23/528* (2013.01); *H01L 23/53209* (2013.01)

(58) Field of Classification Search
CPC ...... H01L 23/3114; H01L 21/78; H01L 21/56; H01L 23/528; H01L 23/562; H01L 21/768; H01L 21/31
See application file for complete search history.

(56) References Cited

U.S. PATENT DOCUMENTS

| 6,486,559 B1 | 11/2002 | Ueno |
| 2003/0071355 A1 | 4/2003 | Dubin et al. |

(Continued)

FOREIGN PATENT DOCUMENTS

| TW | 1402936 B | 7/2013 |
| TW | 201511101 A | 3/2015 |

OTHER PUBLICATIONS

Office Action German Patent Application No. 10 2016 100 002.7 dated Aug. 3, 2016.

(Continued)

*Primary Examiner* — Roy Potter
(74) *Attorney, Agent, or Firm* — McDermott Will & Emery LLP

(57) ABSTRACT

In a method for manufacturing a semiconductor device, a dielectric layer is formed over a substrate. A first pattern and a second pattern are formed in the first interlayer dielectric layer. The first pattern has a width greater than a width of the second pattern. A first metal layer is formed in the first pattern and the second pattern. A second metal layer is formed in the first pattern. A planarization operation is performed on the first and second metal layers so that a first metal wiring by the first pattern and a second metal wiring by the second pattern are formed. A metal material of the first metal layer is different from a metal material of the second metal layer. The first metal wiring includes the first and second metal layers and the second metal wiring includes the first metal layer but does not include the second metal layer.

25 Claims, 12 Drawing Sheets

(56) References Cited

U.S. PATENT DOCUMENTS

2005/0029010 A1* 2/2005 Ahn ................ H01L 21/76847
          174/255
2006/0091551 A1 5/2006 Lin et al.
2006/0289999 A1 12/2006 Lee et al.
2007/0144628 A1 6/2007 Collins
2007/0205482 A1 9/2007 Yang et al.

OTHER PUBLICATIONS

Office Action Taiwan Patent Application No. 10521230730 dated Oct. 6, 2016.

* cited by examiner

SEMICONDUCTOR DEVICE AND MANUFACTURING METHOD THEREOF

TECHNICAL FIELD

The disclosure relates to a semiconductor integrated circuit, more particularly to a semiconductor device having air gaps between metal wirings and its manufacturing process.

BACKGROUND

As the semiconductor industry introduces new generations of integrated circuits (ICs) having higher performance and greater functionality, multi-layer metal wiring structures disposed over the underlying electronic devices such as transistors have been employed. To meet requirements for a higher speed and a more reliability, advanced metal wire forming methods and structures have been developed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 10A-15 show exemplary sequential processes for manufacturing a metal wiring structure for a semiconductor device according to another embodiment of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

FIGS. 1-7 show exemplary sequential processes for manufacturing a metal wiring structure for a semiconductor device according to one embodiment of the present disclosure. In FIGS. 1-7, sequential processes for manufacturing one of metal wiring layers (wiring levels), which are formed above a substrate, are illustrated. Although there are core structures such as transistors or other elements (e.g., contacts etc.) constituting the semiconductor device (hereinafter referred to as "underlying structures") between the substrate and the metal wiring layers, detailed illustrations of such underlying structures are omitted in FIGS. 1-7 for simplicity. Metal wirings are conductive patterns laterally extending in the metal wiring layer and may also be called an interconnection or an interconnect metal layer.

Figure 1:
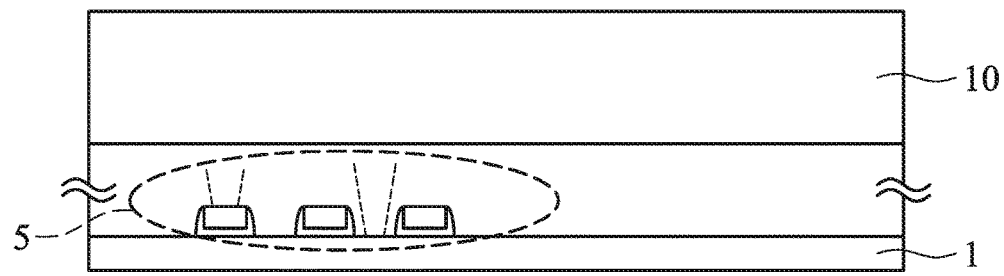
FIGS. 1-7 show exemplary sequential processes for manufacturing a metal wiring structure for a semiconductor device according to one embodiment of the present disclosure.

As shown in FIG. 1, an interlayer dielectric (ILD) layer 10 is formed over the underlying structures 5 disposed over the substrate 1. An interlayer dielectric layer may also be called an inter-metal dielectric (IMD) layer. The ILD layer 10 is made of, for example, one or more layers of low-k dielectric material. Low-k dielectric materials have a k-value (dielectric constant) lower than about 4.0. Some low-k dielectric materials have a k-value lower than about 3.5 and may have a k-value lower than about 2.5.

The materials for the ILD layer 10 may include compounds comprising Si, O, C and/or H, such as SiCOH and SiOC. Organic material such as polymers may be used for the ILD layer 10. For example, the ILD layer 10 is made of one or more layers of a carbon-containing material, organosilicate glass, a porogen-containing material, and/or combinations thereof in certain embodiments. Nitrogen may also be included in the ILD layer 10 in some embodiments. The ILD layer 10 may be a porous layer. The density of the ILD layer 10 is less than about 3 $g/cm^3$ in one embodiment and may be less than about 2.5 $g/cm^3$ in other embodiments. The ILD layer 10 may be formed by using, for example, plasma-enhanced chemical vapor deposition (PECVD), low pressure CVD (LPCVD), atomic layer CVD (ALCVD), and/or a spin-on technology. In case of PECVD, the film is deposited at a substrate temperature in a range of about 25° C. to about 400° C. and at a pressure of less than 100 Torr.

In some embodiments, the ILD layer includes an inter-layer insulating film and an inter-wire insulating film, such that the metal wirings will be formed mainly in the inter-metal insulating film. The inter-layer insulating film may include a SiOC film, and the inter-wire insulating film may include a TEOS (tetraethylorthosilicate) film.

Figure 2A:
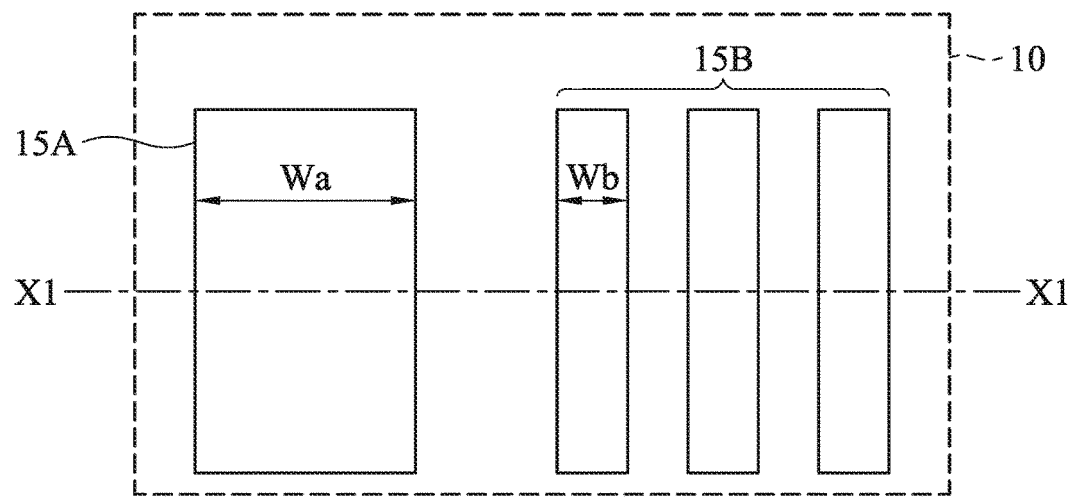
Figure 2B:
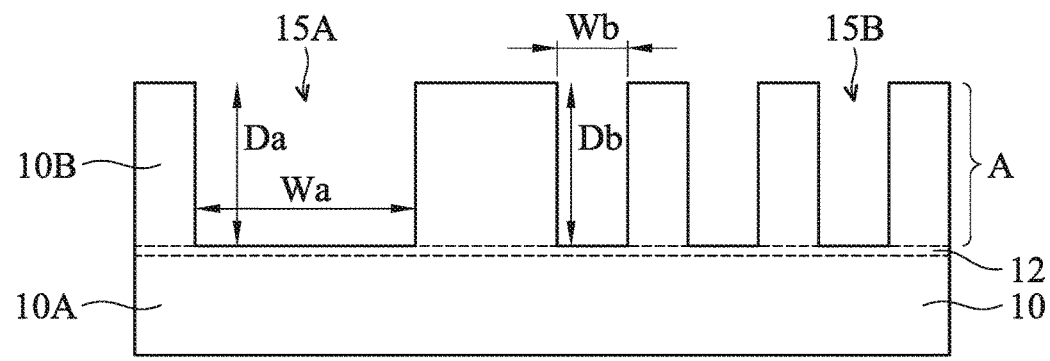

As shown in FIGS. 2A and 2B, one or more first recesses 15A and one or more second recessed 15B are formed in the ILD layer 10 by using patterning operations including lithography and etching processes. FIG. 2A is a top view (a plan view) and FIG. 2B is a cross sectional view along line X1-X1 of FIG. 2A.

In some embodiments, an etch-stop layer 12 may be used so that the bottoms of the recesses 15A and 15B can be defined. In such a case, the ILD layer 10 may include a lower ILD layer 10A and an upper ILD layer 10B with the etch-stop layer 12 being interposed therebetween. The materials for the lower ILD layer 10A and the upper ILD layer 10B may be the same or different. If an etch-stop layer is not used, the depth of the recess may be controlled by controlling an etching time or an etching rate of the recess etching. In the following explanations, the upper portion of the ILD 10 in which the recesses are formed is referred to as upper ILD layer 10B and the lower portion of the ILD 10 is referred to as lower ILD layer 10A, regardless of the existence or non-existence of the etch-stop layer 12.

As shown in FIGS. 2A and 2B, the first recess 15A has a width Wa, which is greater than a width Wb of the second recesses 15B. In one embodiment, the width Wa is greater than about 40 nm and less than about 100 μm, and the width Wb is in a range from about 40 nm to about 5 nm. In other embodiments, the width Wa is greater than about 60 nm and the width Wb is in a range from about 30 nm to 10 nm. As shown in FIG. 2A, the recesses 15A and 15B correspond to metal wirings, which generally have a shape of a long extending line. The width is defined in a direction perpendicular to the extending direction of the metal wirings (recesses).

The depth Da of the first recess 15A is in a range from about 40 nm to about 100 nm in some embodiments, and is in a range from about 50 nm to about 80 nm in other embodiments. The depth Db of the second recesses 15B is substantially the same as the depth Da or slightly smaller than the depth Da.

The aspect ratio (depth/width) of the first recess 15A is smaller than about 1, and the aspect ratio of the second recesses 15B is in a range from about 1 to about 10.

Figure 3:
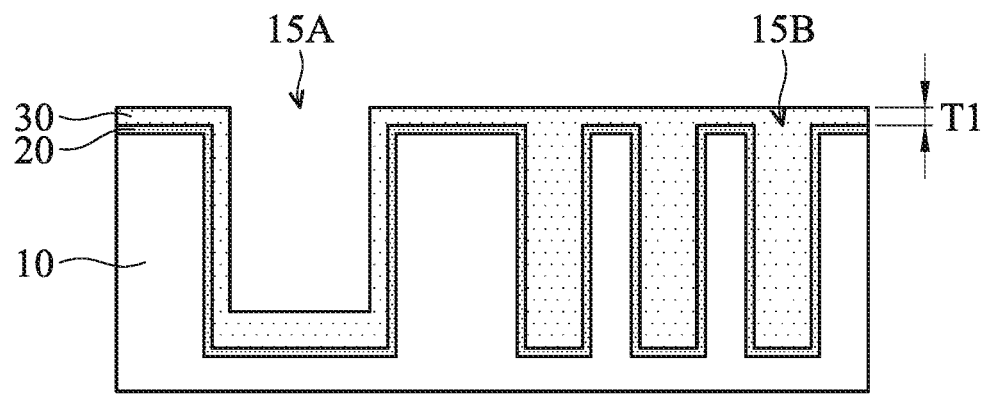

As shown in FIG. 3, a barrier layer 20 is formed in the recesses and over the ILD 10. The barrier layer 20 is made of, for example, a transition metal nitride such as TaN or TiN. A thickness of the barrier layer 20 is in a range from about 1 nm to 3 nm in some embodiment, and is in a range from about 1.5 nm to about 2.5 nm in other embodiments. The barrier layer can be formed by using chemical vapor deposition (CVD), physical vapor deposition (PVD), atomic layer deposition (ALD) or electro-plating such as electrodeless plating.

Next, a first metal layer 30 is formed over the barrier layer 20. The first metal layer 30 is made of one or more of Cu, Co, Al, Ru and Ag. The first metal layer 30 can be formed by ALD, PVD or CVD. The thickness T1 of the first metal layer on the upper surface of the ILD 10 is about 50% or more and about 100% or less of the width Wb of the second recesses 15B and less than about 40 nm.

With this metal layer formation operation, the second recesses 15B are substantially fully filled by the first metal layer 30, while the first recess 15A is not fully filled by the first metal layer 30, as shown in FIG. 3.

Figure 4:
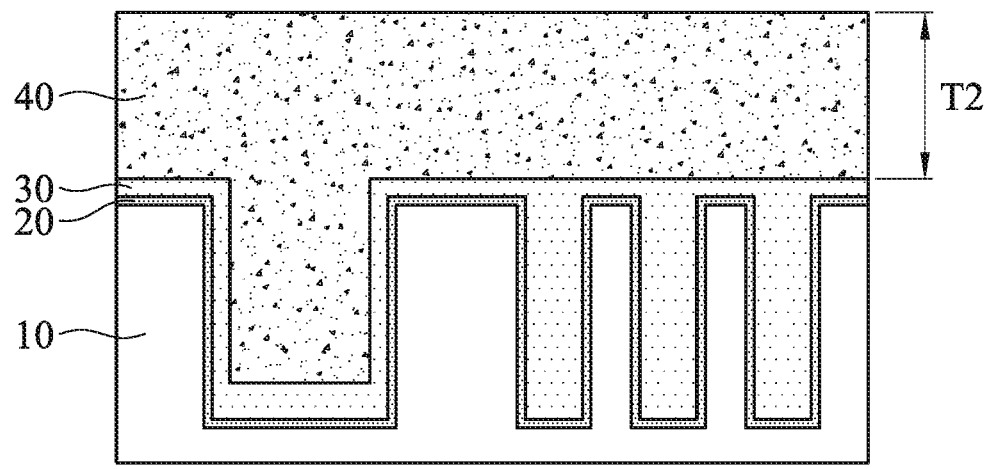

Then, as shown in FIG. 4, a second metal layer 40 is formed over the first metal layer 30. The second metal layer 40 is made of one or more of Cu, Co, Al and Ag, and made of a different material than the first metal layer 30. The second metal layer 40 can be formed by PVD, CVD or electro-plating. The thickness T2 of the second metal layer on the upper surface of the ILD 10 is about 50% or more of the width Wa of the first recesses 15A and less than about 1000 nm. In some embodiments, T2 is in a range from about 150 nm to about 1000 nm.

The second metal layer 40 is made of a different material than the first metal layer 30. For example, when the first metal layer 30 is made of Co, the second metal layer 40 is made of Cu, Al or Ag, and when the first metal layer 30 is made of Cu, the second metal layer 40 is made of Co, Al or Ag. In one embodiment, the first metal layer 30 is made of Co and the second metal layer 40 is made of Cu. With these metal layer formation operations, the first recess 15A is substantially fully filled by the first metal layer 30 and the second metal layer 40.

After the second metal layer 40 is formed, a planarization operation such as a chemical mechanical polishing (CMP) operation is performed. In the present embodiment, the planarization operation includes three CMP operations.

Figure 5:
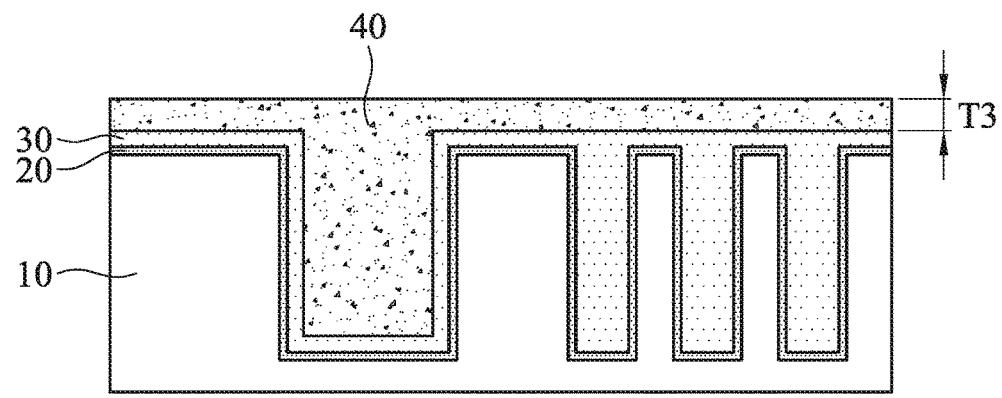

As shown in FIG. 5, by the first CMP operation, the second metal layer 40 is partially removed. The remaining thickness T3 of the second metal layer 40 on the upper surface of the ILD 10 is in a range from about 80 nm to about 120 nm in some embodiments. The first CMP operation is performed with a relatively high etching rate.

Figure 6:
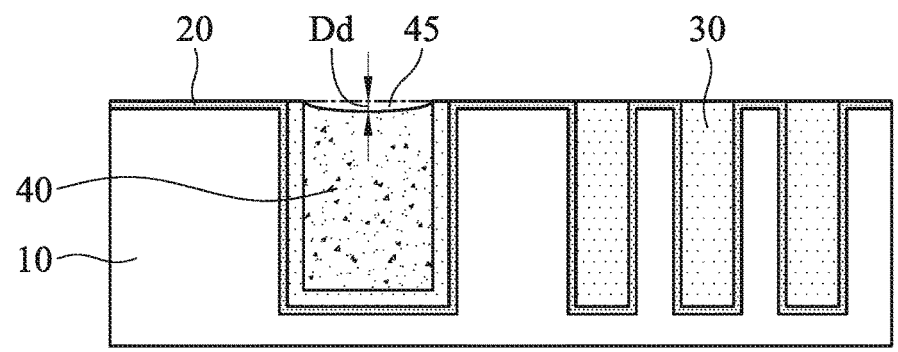

Then, the second CMP operation is performed to partially remove the second metal layer 40 and the first metal layer 30, and the CMP stops at the barrier layer 20 on the upper surface of the ILD 10, as shown in FIG. 6. The second CMP operation is performed with a relatively low etching rate.

The first slurry used in the first CMP has an etching selectivity of about 2 or more for the second metal layer 40 against the first metal layer 30. The second slurry used in the second CMP has an etching selectivity of about 2 or more for the first metal layer 30 against the second metal layer 40. Etching selectivity of the slurries can be controlled by adjusting at least one of a type of polishing particles, a pH value, a type of surfactant, a type of corrosion inhibitor and a type of chelator or enhancer.

In the second CMP operation, after the first metal layer 30 is exposed, the etching rate for the second metal layer 40 is smaller than the etching rate for the first metal layer 30. Accordingly, even though the first recess 15A has a broader pattern width, a dishing effect for the second metal layer 40 can be minimized. In one embodiment, the dishing amount Dd at the center of the metal-filled recess 15A measured from the upper surface of the barrier layer 20 is in a range from about 10 nm to about 20 nm.

Figure 7:
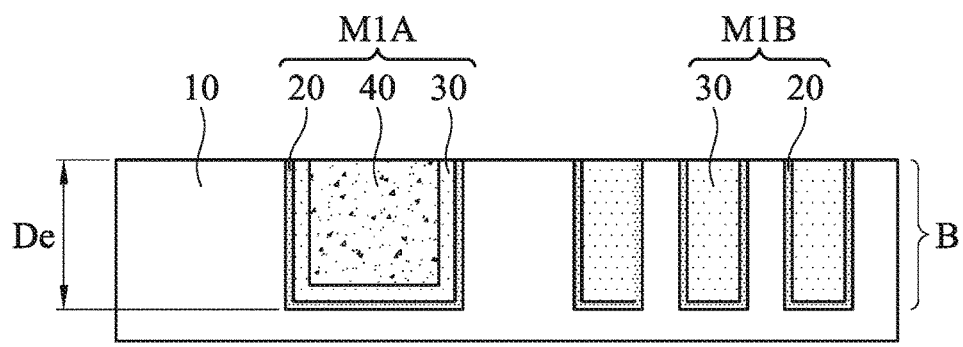

After the second CMP operation, the third CMP operation is performed to remove the barrier layer 20 disposed on the upper surface of the ILD 10 and to obtain a desirable thickness and flatness of the metal layers, as shown in FIG. 7. The third slurry used in the third CMP has a substantially equal etching rate for the second metal layer 40 and the first metal layer 30.

By the third CMP operation, a first metal wiring M1A and a second metal wiring M1B are formed in one metal layer level (the same metal layer level) disposed in the same interlayer dielectric layer. The first metal wiring M1A includes the barrier layer 20, the first metal layer 30 and the second metal layer 40, and the second metal wiring M1B includes the barrier layer 20 and the first metal layer 30 without the second metal layer 40. In other words, the layer structures of the first metal wiring M1A and the second metal wiring M1B are different and in particular, the number of conductive layers of the first metal wiring M1A is different (greater) than the number of conductive layers of the second metal wiring M1B. After the metal wirings in the one metal layer are formed, a second ILD is formed over the ILD 10 and the metal wirings M1A and M1B. The metal wirings M1A and M1B extend laterally in a plan view and are used electrically connect different elements located at laterally different positions.

Figure 8:
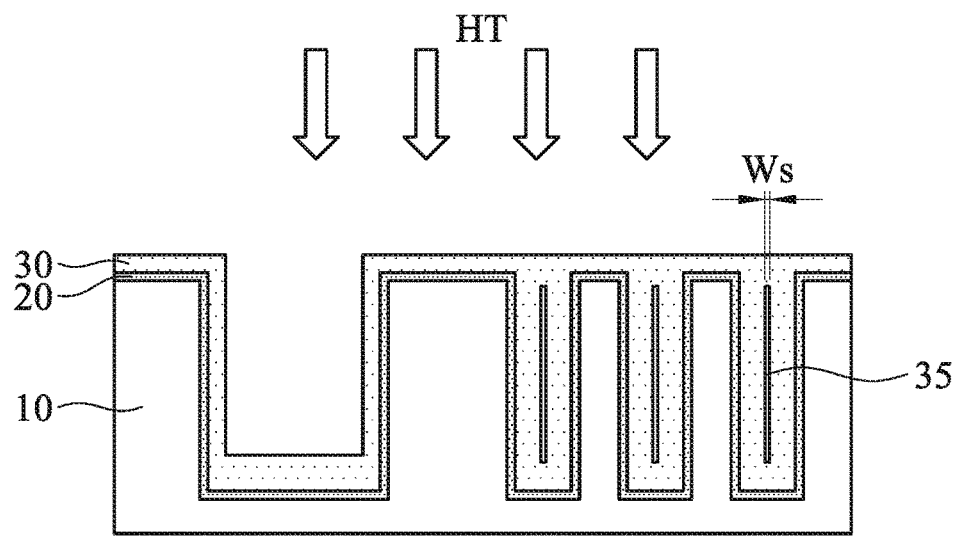
FIGS. 8 and 9 show exemplary cross sectional views in one of the sequential processes for manufacturing a metal wiring structure according to another embodiment of the present disclosure.

In the above embodiment, as shown in FIG. 3, the second recesses 15B are substantially fully filled by the first metal layer 30. However, in some embodiments, a seam or a void 35 is formed in the second recess 15B, as shown in FIG. 8. The width Ws of the seam or a void 35 is in a range from about 1 nm to about 5 nm.

When a seam or a void is formed, a thermal treatment HT is performed to remove the seam or the void 35, as shown in FIG. 8. The thermal treatment includes a rapid thermal annealing (RTA) operation or a heating operation in a furnace. In some embodiments, the RTA is performed at a temperature in a range from about 200° C. to about 500° C. for about 1 minute to about 10 minutes in an inert gas (e.g., Ar and/or $N_2$) ambient. The furnace heating may be performed at a temperature in a range from about 200° C. to about 500° C. for about 10 minute to about 30 minutes in an inert gas (e.g., Ar and/or $N_2$) ambient. By the heat treatment, grains in the first metal layer 30 grow and fill the seam or void 35.

Figure 9:
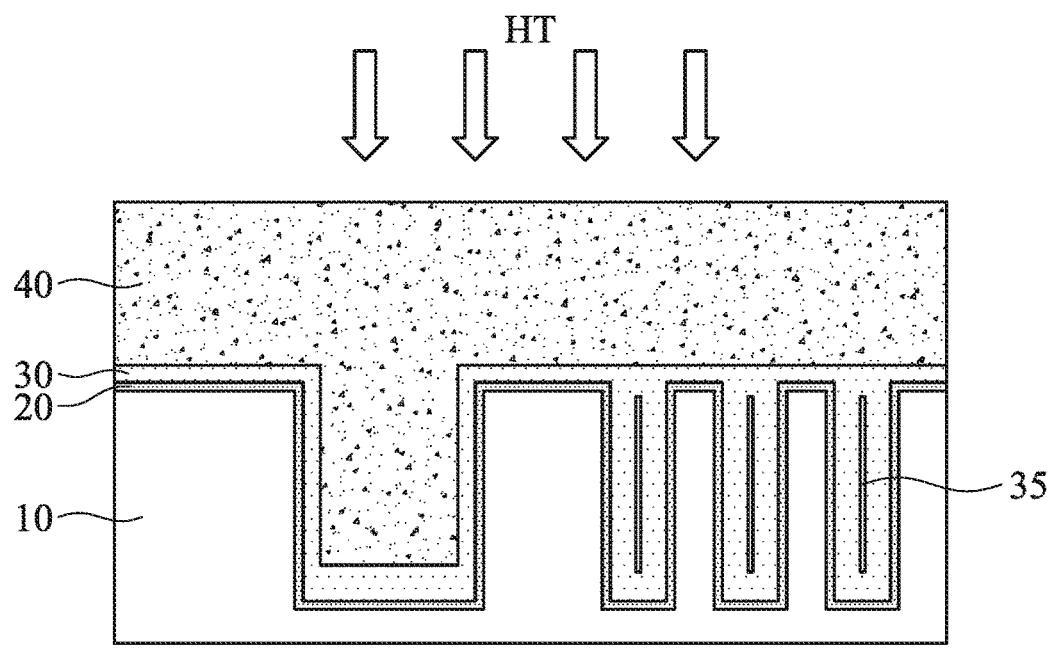
Figure 10:
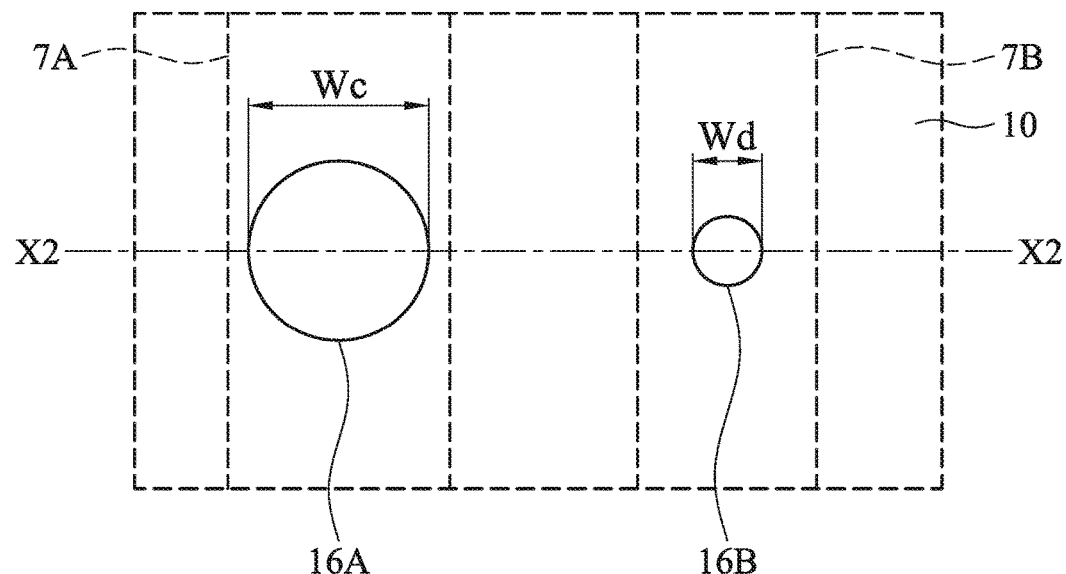
Figure 10:
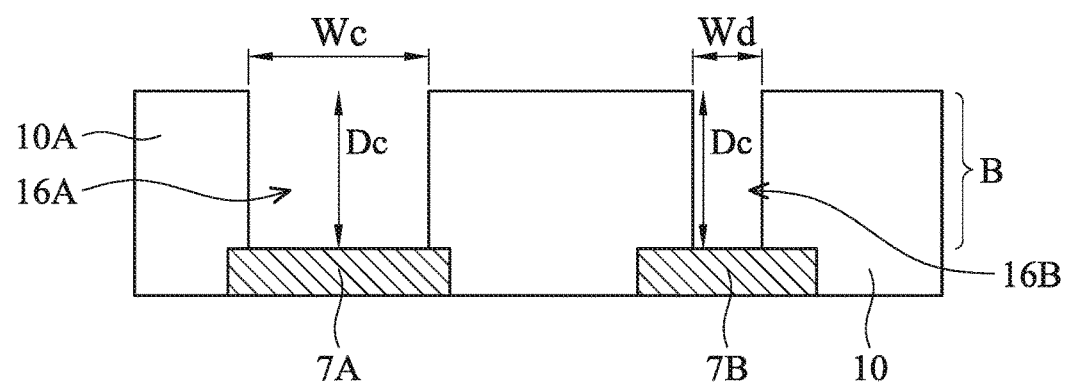

In some embodiments, the heat treatment HT is performed after the second metal layer 40 is formed, as shown in FIG. 9. The heat treatment HT may be performed after or between the planarization operations. The heat treatment may be performed twice or more, for example, after the formation of the first metal layer and after the second metal layer, respectively.

FIGS. 10A-15 show exemplary sequential processes for manufacturing a metal wiring structure for a semiconductor device according to another embodiment of the present disclosure.

In FIGS. 10A-15, sequential processes for manufacturing one of via layers (via levels), which are formed between two metal wiring layers (levels) or between one metal wiring layer and the underlying structures in a vertical direction above a substrate, are illustrated. Vias are conductive patterns vertically extending in the via layer and connect a lower-layer conductive pattern and an upper-layer conductive pattern. A via may also be called a via plug or a contact plug. The same or similar structures, operations, processes and/or materials described with respect to FIGS. 1-9 may be applied to the following embodiments and the details thereof may be omitted for simplicity.

Similar to FIG. 1, an interlayer dielectric (ILD) layer 10 is formed over the underlying structures 5 disposed over the substrate 1. In this embodiment, the ILD layer 10A corresponding to the lower portion of the ILD 10 of FIG. 2B is formed.

As shown in FIGS. 10A and 10B, one or more first via holes 16A and one or more second via holes 16B are formed in the ILD layer 10A by using patterning operations including lithography and etching processes. FIG. 10A is a top view (a plan view) and FIG. 10B is a cross sectional view along line X2-X2 of FIG. 10A.

As shown in FIGS. 10A and 10B, the first via hole 16A is formed over the lower conductive pattern 7A and the second via hole 16B is formed over the lower conductive pattern 7B. The lower conductive patterns 7A and 7B are exposed at the bottoms of the first and second via holes 16A and 16B, respectively. The lower conductive patterns 7A and 7B may be conductive patterns in the underlying core structures or conductive patterns in the lower metal wiring layer.

As shown in FIGS. 10A and 10B, the first via hole 16A has a width Wc, which is greater than a width Wd of the second via hole 16B. In one embodiment, the width Wc is greater than about 40 nm and less than about 150 nm, and the width Wd is in a range from about 40 nm to about 5 nm. In other embodiments, the width Wc is greater than about 60 nm and the width Wd is in a range from about 30 nm to 10 nm. As shown in FIG. 10A, the via holes 16A and 16B have a substantially circular shape in a plan view. The width is defined as a diameter of the circle. When the dimension of the first via hole is sufficiently large, the shape of the first via hole is a rounded square. If the via holes have a rectangular shape on a design plan, the via holes formed in the ILD 10A has an ellipsoid shape or a round rectangular shape.

The depth Dc of the first via hole 16A and the second via hole 16B is in a range from about 40 nm to about 100 nm in some embodiments, and is in a range from about 50 nm to about 80 nm in other embodiments.

The aspect ratio (depth/width) of the first via hole 16A is smaller than about 1, and the aspect ratio of the second via hole 16B is in a range from about 1 to about 10.

Figure 11:
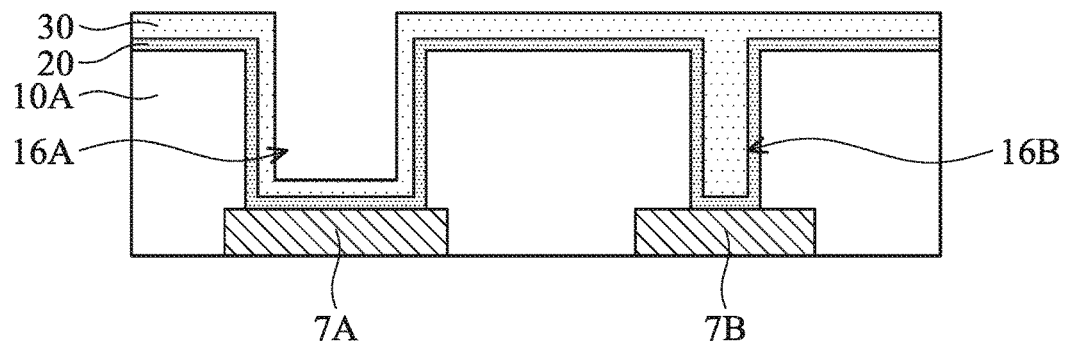

Similar to FIG. 3, a barrier layer 20 is formed in the recesses and over the ILD 10A, as shown in FIG. 11. The barrier layer 20 is made of, for example, a transition metal nitride such as TaN or TiN. A thickness of the barrier layer 20 is in a range from about 1 nm to 3 nm in some embodiment, and is in a range from about 1.5 nm to about 2.5 nm in other embodiments. The barrier layer can be formed by using chemical vapor deposition (CVD), physical vapor deposition (PVD), atomic layer deposition (ALD) or electro-plating such as electrodeless plating.

Next, similar to FIG. 3, a first metal layer 30 is formed over the barrier layer 20, as shown in FIG. 11. The first metal layer 30 is made of one or more of Cu, Co, Ru, Al and Ag. The first metal layer 30 can be formed by ALD, PVD or CVD. The thickness T1 of the first metal layer on the upper surface of the ILD 10 is about 50% or more and about 100% or less of the width Wd of the second via holes 16B and less than about 40 nm.

With this metal layer formation operation, the second via holes 16B are substantially fully filled by the first metal layer 30, while the first via hole 16A is not fully filled by the first metal layer 30, as shown in FIG. 11.

Figure 12:
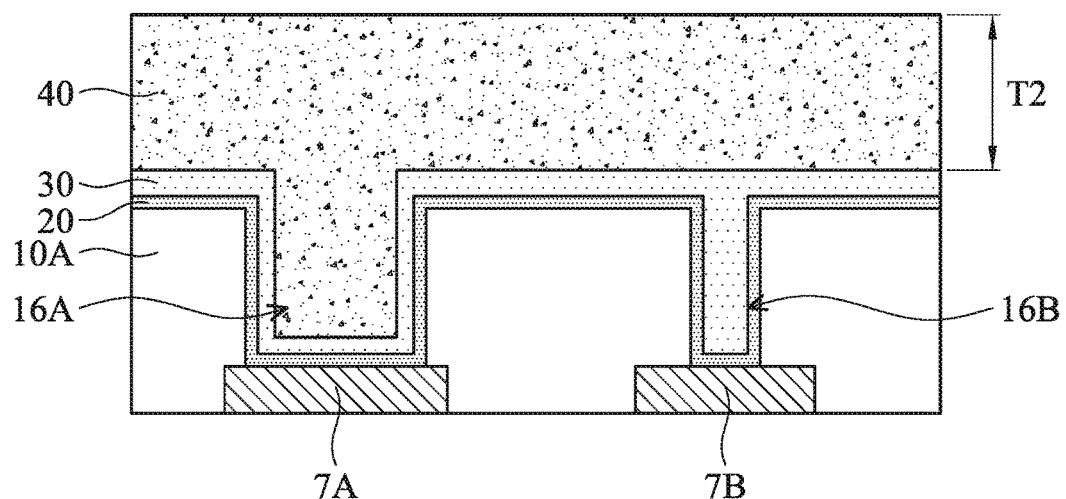

Then, as shown in FIG. 12, a second metal layer 40 is formed over the first metal layer 30. The second metal layer 40 is made of one or more of Cu, Co, Al and Ag, and made of a different material than the first metal layer 30. The second metal layer 40 can be formed by PVD, CVD or electro-plating. The thickness T2 of the second metal layer on the upper surface of the ILD 10 is about 50% or more of the width Wc of the first via holes 16A and less than about 600 nm. In some embodiments, T2 is in a range from about 100 nm to about 600 nm. In one embodiment, the first metal layer 30 is made of Co and the second metal layer 40 is made of Cu. With these metal layer formation operations, the first via hole 16A is substantially fully filled by the first metal layer 30 and the second metal layer 40.

After the second metal layer 40 is formed, a planarization operation such as a chemical mechanical polishing (CMP) operation is performed. In the present embodiment, the planarization operation includes three CMP operations.

Figure 13:
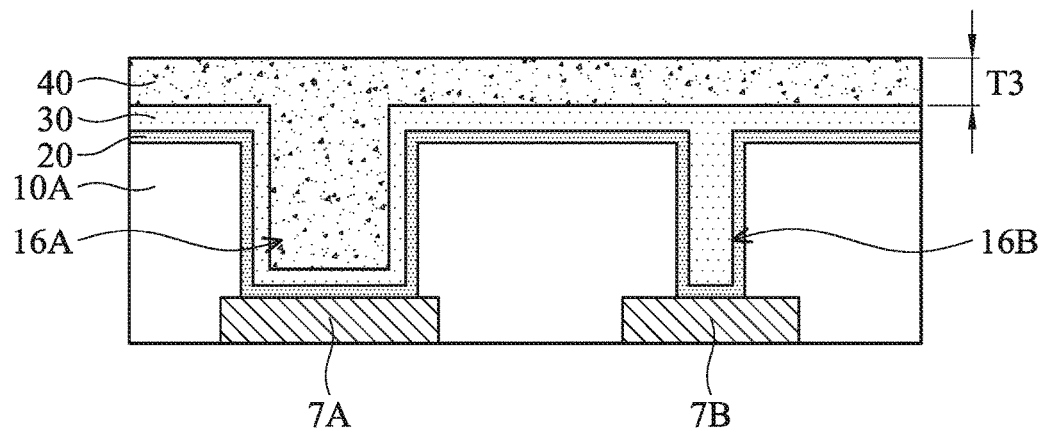

As shown in FIG. 13, by the first CMP operation, the second metal layer 40 is partially removed. The remaining thickness T3 of the second metal layer 40 on the upper surface of the ILD 10A is in a range from about 80 nm to about 120 nm in some embodiments. The first CMP operation is performed with a relatively high etching rate.

Figure 14:
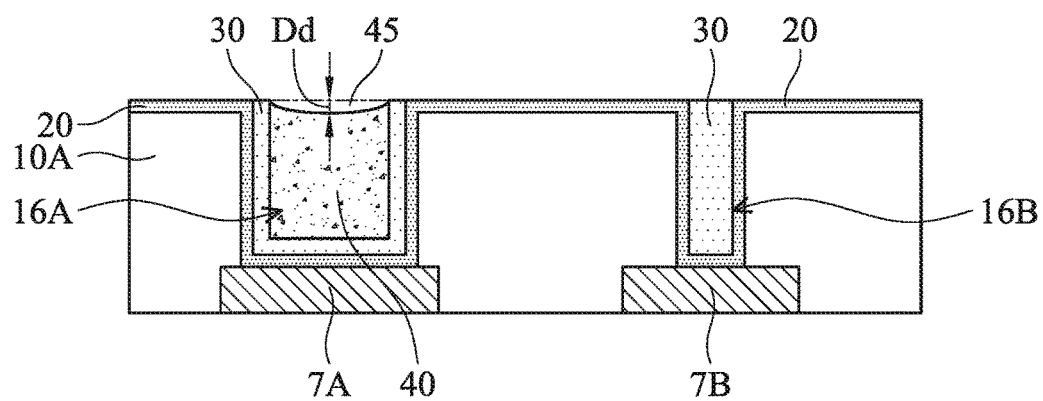

Then, the second CMP operation is performed to partially remove the second metal layer 40 and the first metal layer 30. The CMP stops at the barrier layer 20 on the upper surface of the ILD 10A, as shown in FIG. 14. The second CMP operation is performed with a relatively low etching rate.

The first slurry used in the first CMP has an etching selectivity of about 2 or more for the second metal layer 40 against the first metal layer 30. The second slurry used in the second CMP has an etching selectivity of about 2 or more for the first metal layer 30 against the second metal layer 40.

In the second CMP operation, after the first metal layer 30 is exposed, the etching rate for the second metal layer 40 is smaller than the etching rate for the first metal layer 30. Accordingly, even though the first via hole 16A has a broader pattern width, a dishing effect for the second metal layer 40 can be minimized. In one embodiment, the dishing amount Dd at the center of the metal-filled recess 16A measured from the upper surface of the barrier layer 20 is in a range from about 10 nm to about 20 nm.

Figure 15:
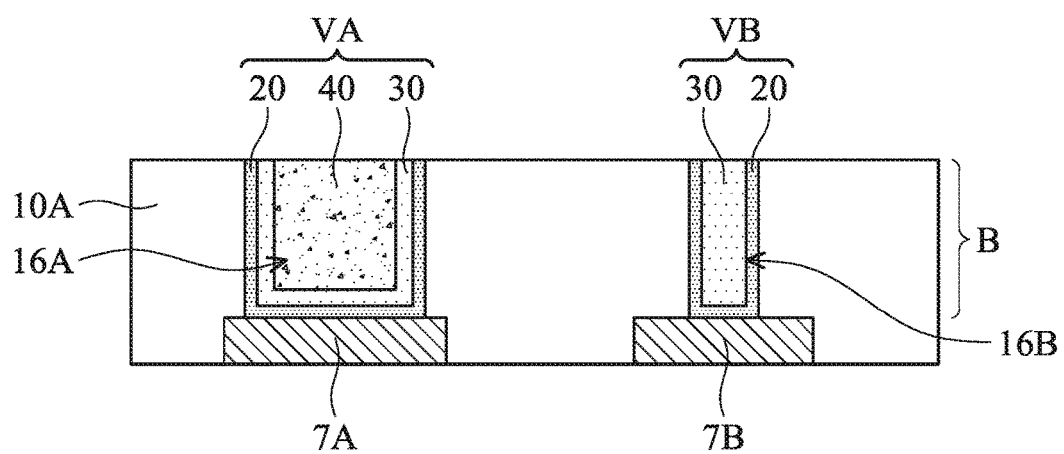

After the second CMP operation, the third CMP operation is performed to remove the barrier layer 20 disposed on the upper surface of the ILD 10A and to obtain a desirable thickness and flatness of the via plugs, as shown in FIG. 15. The third slurry used in the third CMP has a substantially equal etching rate for the second metal layer 40 and the first metal layer 30.

By the third CMP operation, a first via plug VA and a second via plug VB are formed in one via layer level. The first via plug VA includes the barrier layer 20, the first metal layer 30 and the second metal layer 40, and the second via plug VB includes the barrier layer 20 and the first metal layer 30 without the second metal layer 40. After the via plugs in the one via layer are formed, a second ILD is formed over the ILD 10A and the via plugs VA and VB. The via plugs VA and VB are used for connecting an upper layer element and a lower layer element, respectively.

When a seam or a void is formed in the first metal layer 30 similar to FIGS. 8 and 9, a heat treatment is performed to remove the seam or the void.

FIGS. 16A-21 show exemplary sequential processes for manufacturing a metal wiring structure for a semiconductor device according to another embodiment of the present disclosure.

In FIGS. 16A-21, sequential processes for manufacturing one of metal wiring layers (wiring levels) and one of via layers disposed just under the one of the metal wiring layers are illustrated. Although there are core structures such as transistors or other elements (e.g., contacts etc.) constituting the semiconductor device (hereinafter referred to as "underlying structures") between the substrate and the metal wiring layers, detailed illustrations of such underlying structures are omitted in FIGS. 16A-21 for simplicity. The same or similar structures, operations, processes and/or materials described with respect to FIGS. 1-15 may be applied to the following embodiments and the details thereof may be omitted for simplicity.

As shown in FIG. 1, an interlayer dielectric (ILD) layer 10 is formed over the underlying structures 5 disposed over the substrate 1.

Figure 16A:
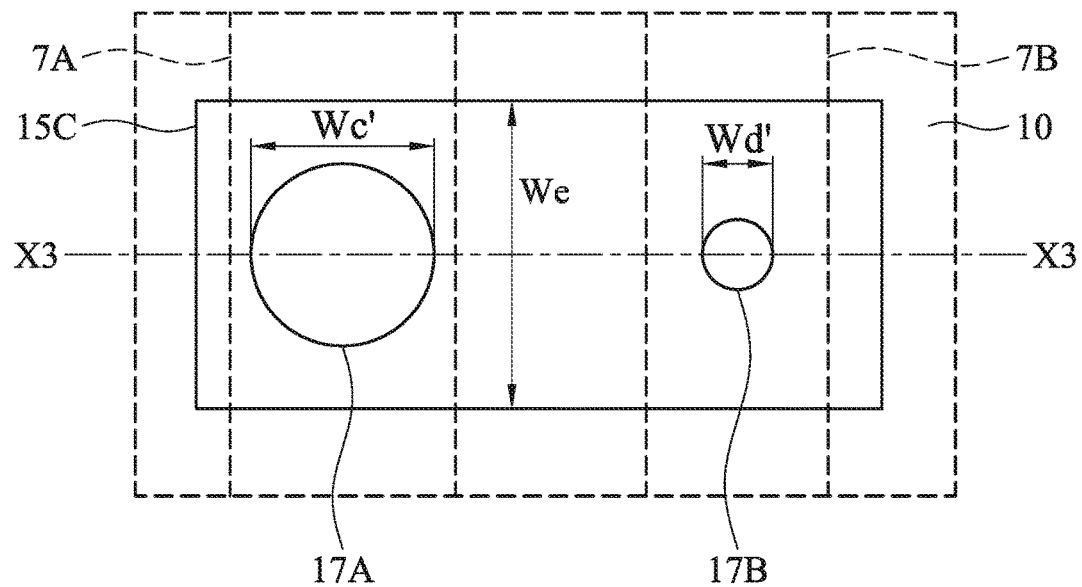
FIGS. 16A-21 show exemplary sequential processes for manufacturing a metal wiring structure for a semiconductor device according to another embodiment of the present disclosure.
Figure 16B:
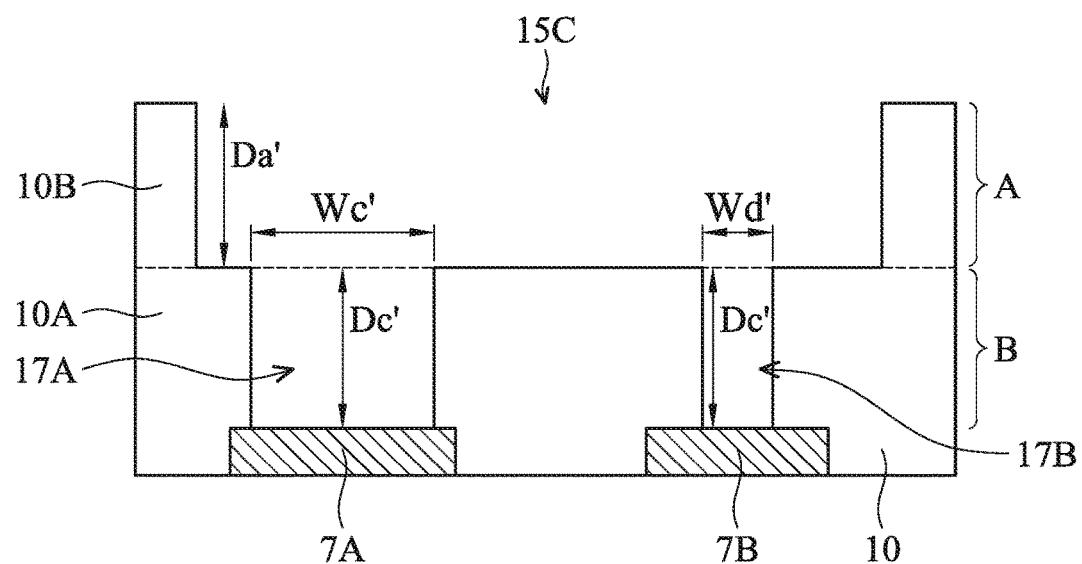

As shown in FIGS. 16A and 16B, one or more recess 15C are formed in the upper ILD 10B of the ILD 10, and one or more first via holes 17A and one or more second via holes 17B are formed in the lower ILD layer 10A, by using patterning operations including lithography and etching processes. FIG. 16A is a top view (a plan view) and FIG. 16B is a cross sectional view along line X3-X3 of FIG. 16A.

As shown in FIGS. 16A and 16B, the first via hole 17A is formed over the lower conductive pattern 7A and the second via hole 17B is formed over the lower conductive pattern 7B. The lower conductive patterns 7A and 7B are exposed at the bottoms of the first and second via holes 17A and 17B, respectively. The lower conductive patterns 7A and 7B may be conductive patterns in the underlying core structures or conductive patterns in the lower metal wiring layer.

As shown in FIGS. 16A and 16B, the first via hole 17A has a width Wc', which is greater than a width Wd' of the second via hole 17B. In one embodiment, the width Wc' is greater than about 40 nm and the width Wd' is in a range from about 40 nm to about 5 nm. The value Wc'/Wd' is less than about 25. In other embodiments, the width Wc' is greater than about 60 nm and the width Wd' is in a range from about 30 nm to 10 nm. The recess 15C has a width We, which is greater than the width Wd' of the second via hole 17B. The width We may be equal to or greater than the width Wc' of the first via hole 17A. Although the first and second via holes 17A and 17B are formed in one recess 15C in FIGS. 16A and 16B, the first and second via holes may be formed in different recesses.

The depth Da' of the recess 15C is in a range from about 40 nm to about 100 nm in some embodiments, and is in a range from about 50 nm to about 80 nm in other embodiments. The depth Dc' of the first via hole 17A and the second via hole 17B is in a range from about 40 nm to about 100 nm in some embodiments, and is in a range from about 50 nm to about 80 nm in other embodiments.

The aspect ratio (depth/width) of the recess 15C is smaller than about 1. The aspect ratio (depth/width) of the first via hole 17A is smaller than about 1, and the aspect ratio of the second via hole 17B is in a range from about 1 to about 10.

Figure 17:
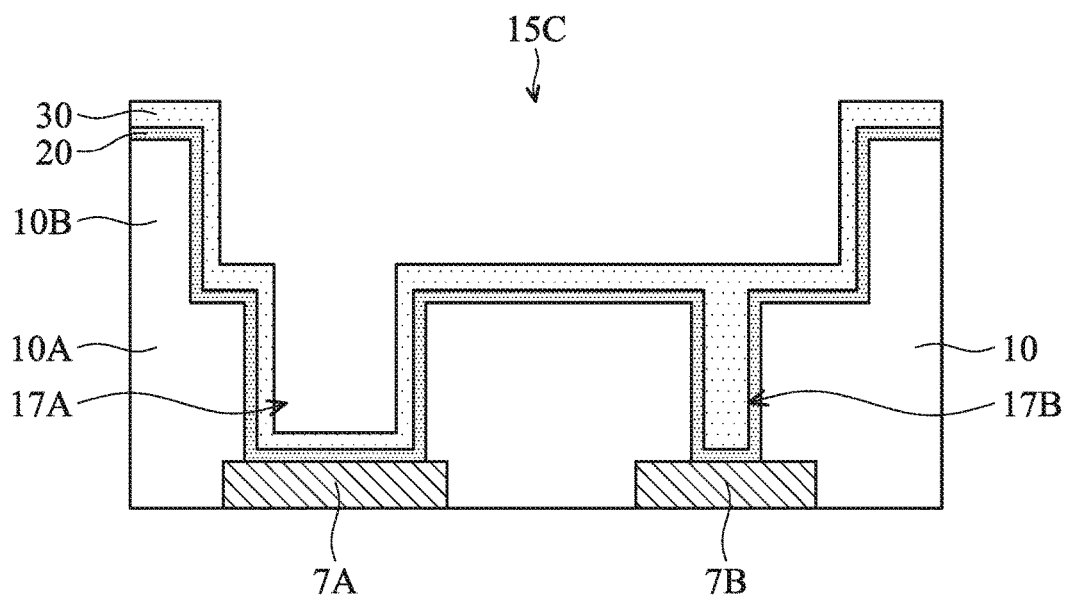

As shown in FIG. 17, a barrier layer 20 is formed in the recess 15C, the first and second via holes 17A and 17B and over the ILD 10B. The barrier layer 20 is made of, for example, a transition metal nitride such as TaN or TiN. A thickness of the barrier layer 20 is in a range from about 1 nm to 3 nm in some embodiments, and is in a range from about 1.5 nm to about 2.5 nm in other embodiments. The barrier layer can be formed by using chemical vapor deposition (CVD), physical vapor deposition (PVD), atomic layer deposition (ALD) or electro-plating such as electrodeless plating.

Next, a first metal layer 30 is formed over the barrier layer 20. The first metal layer 30 is made of one or more of Cu, Co, Ru, Al and Ag. The first metal layer 30 can be formed by ALD, PVD or CVD. The thickness T1 of the first metal layer on the upper surface of the ILD 10 is about 50% or more and about 100% or less of the width Wd' of the second via hole 17B and less than about 40 nm.

With this metal layer formation operation, the second via hole 17B is substantially fully filled by the first metal layer 30, while the recess 15C and the first via hole 17A are not fully filled by the first metal layer 30, as shown in FIG. 17.

Figure 18:
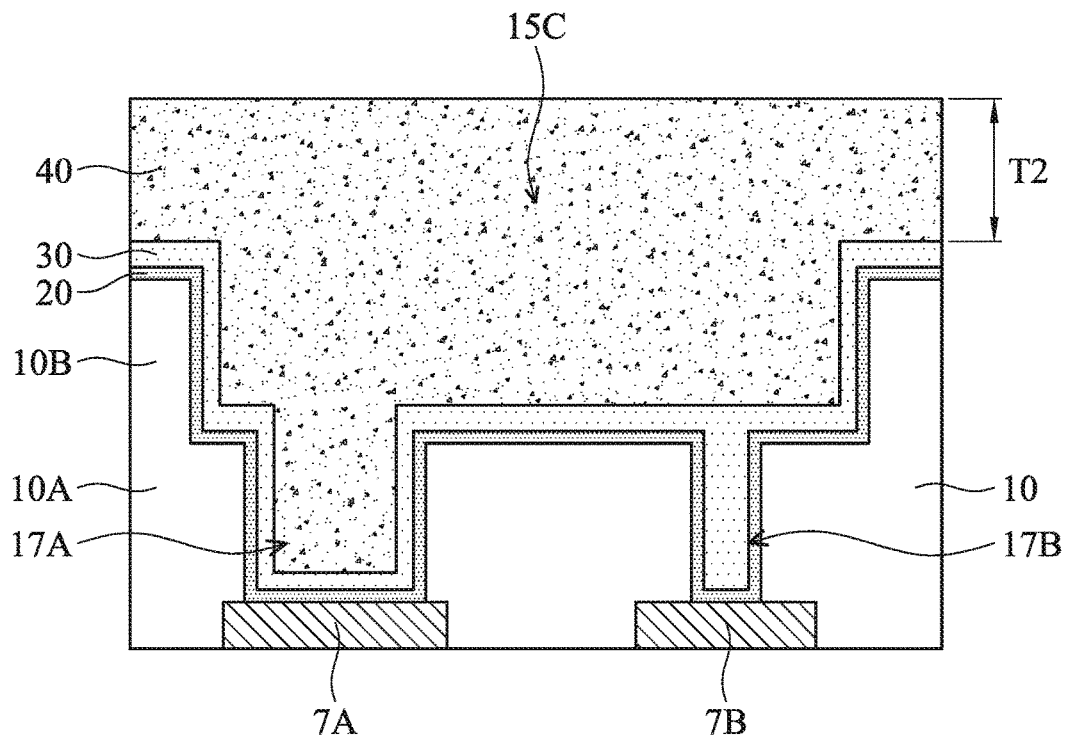

Then, as shown in FIG. 18, a second metal layer 40 is formed over the first metal layer 30. The second metal layer 40 is made of one or more of Cu, Co, Al and Ag, and made of a different material than the first metal layer 30. The second metal layer 40 can be formed by PVD, CVD or electro-plating. The thickness T2 of the second metal layer on the upper surface of the ILD 10B is about 50% or more of the width We of the recess 15C and less than about 1000 nm. In some embodiments, T2 is in a range from about 150 nm to about 1000 nm.

The second metal layer 40 is made of a different material than the first metal layer 30. For example, when the first metal layer 30 is made of Co, the second metal layer 40 is made of Cu, Al or Ag, and when the first metal layer 30 is made of Cu, the second metal layer 40 is made of Co, Al or Ag. In one embodiment, the first metal layer 30 is made of Co and the second metal layer 40 is made of Cu. With these metal layer formation operations, the recess 15C and the first via hole 17A are substantially fully filled by the first metal layer 30 and the second metal layer 40.

After the second metal layer 40 is formed, a planarization operation such as a chemical mechanical polishing (CMP) operation is performed. In the present embodiment, the planarization operation includes three CMP operations.

Figure 19:
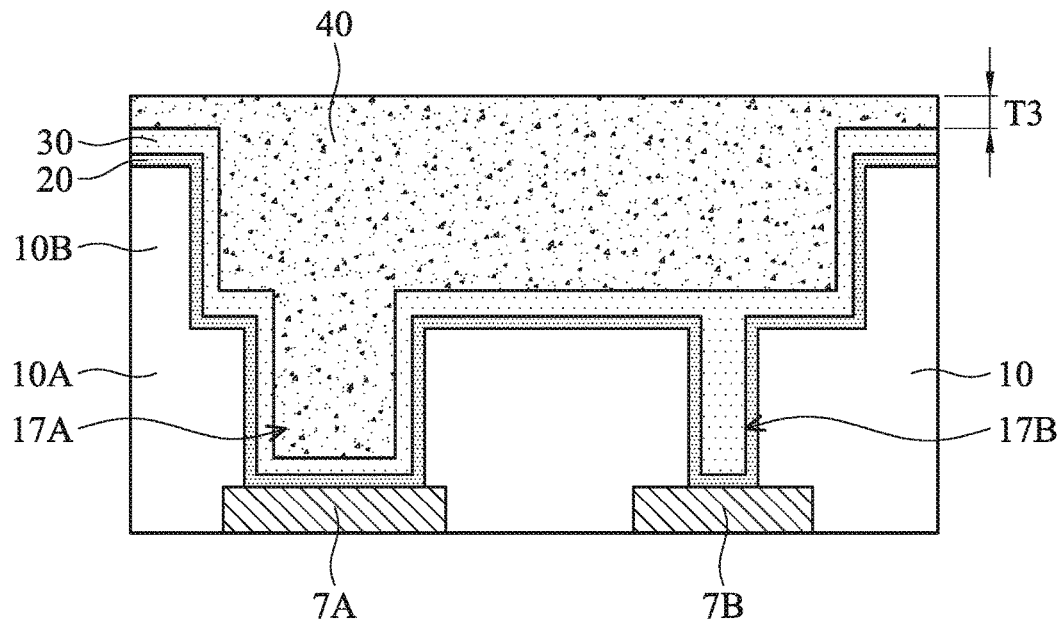
Figure 20:
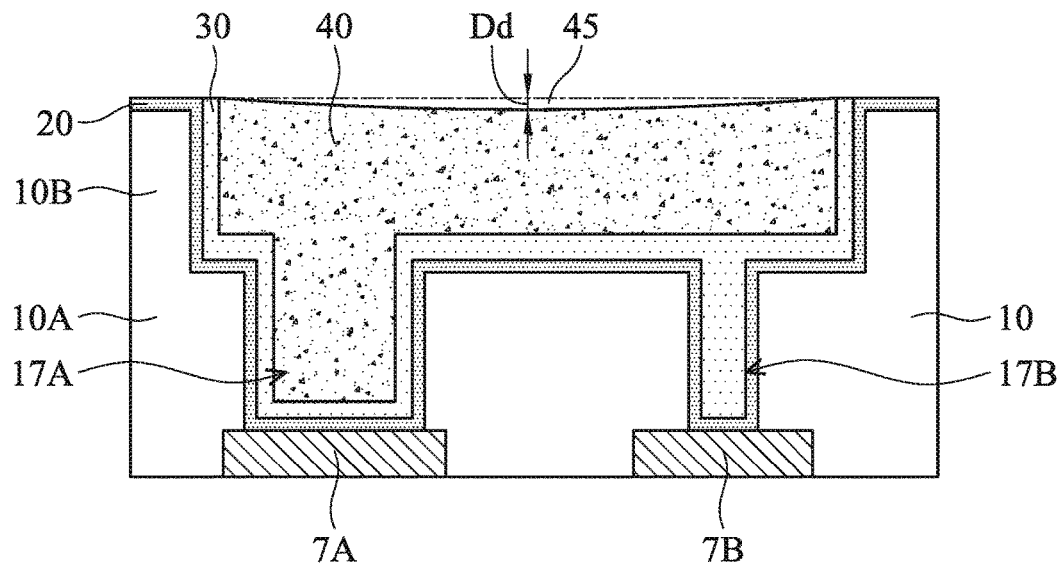

As shown in FIG. 19, by the first CMP operation, the second metal layer 40 is partially removed. The remaining thickness T3 of the second metal layer 40 on the upper surface of the ILD 10B is in a range from about 80 nm to about 120 nm in some embodiments. The first CMP operation is performed with a relatively high etching rate.

Then, the second CMP operation is performed to partially remove the second metal layer 40 and the first metal layer 30, and the CMP stops at the barrier layer 20 on the upper surface of the ILD 10B, as shown in FIG. 19. The second CMP operation is performed with a relatively low etching rate.

In the second CMP operation, after the first metal layer 30 is exposed, the etching rate for the second metal layer 40 is smaller than the etching rate for the first metal layer 30. Accordingly, even though the first recess 15A has a broader pattern width, a dishing effect for the second metal layer 40 can be minimized. In one embodiment, the dishing amount Dd at the center of the metal-filled recess 15C, measured from the upper surface of the barrier layer 20, is in a range from about 10 nm to about 20 nm.

Figure 21:
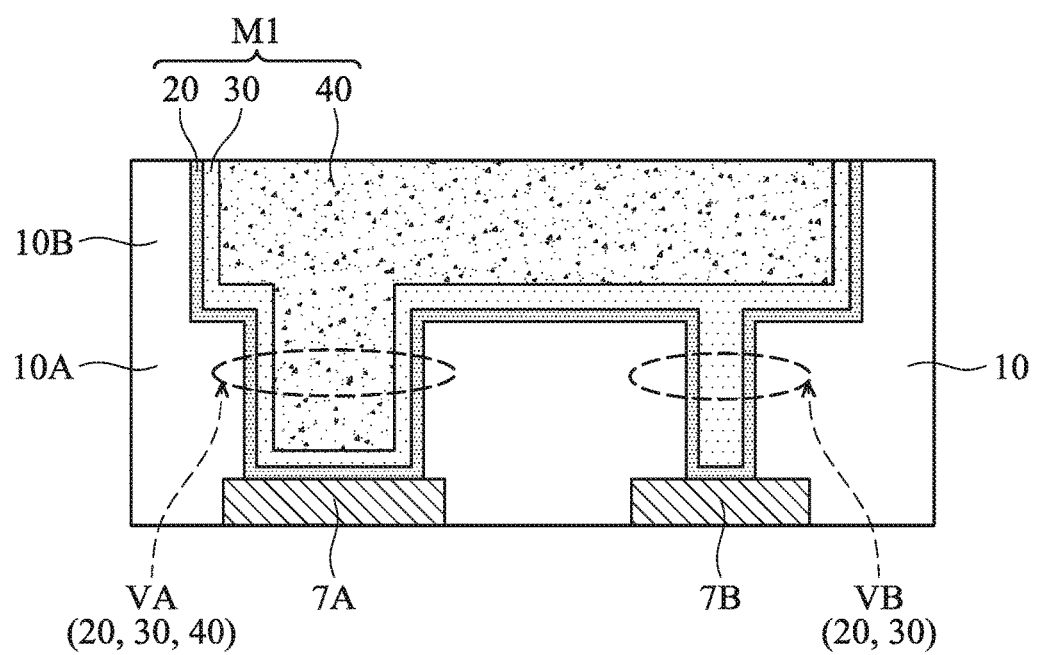

After the second CMP operation, the third CMP operation is performed to remove the barrier layer 20 disposed on the upper surface of the ILD 10B and to obtain a desirable thickness and flatness of the metal layers, as shown in FIG. 21. The third slurry used in the third CMP has a substantially equal etching rate for the second metal layer 40 and the first metal layer 30.

By the third CMP operation, a metal wiring M1 is formed in one metal layer level, and a first via plug VA and a second via plug VB are formed in one via layer level under the one metal layer level. The metal wiring M1 and the first via plug VA include the barrier layer 20, the first metal layer 30 and the second metal layer 40, and the second via plug VB includes the barrier layer 20 and the first metal layer 30 without the second metal layer 40. After the metal wirings in the one metal layer are formed, a second ILD is formed over the ILD 10B and the metal wiring MA and via plugs VA and VB.

When a seam or a void is formed in the first metal layer 30 similar to FIGS. 8 and 9, a heat treatment is performed to remove the seam or the void.

The above embodiments are not exclusive with each other, and the different embodiments may be combined. Further, the number of patterns (e.g., recesses, via holes) is not limited to the numbers shown in the drawings.

The various embodiments or examples described herein offer several advantages over the existing art. For example, in the present disclosure, since two different metal layers and two different planarization operations (CMPs) are utilized, it is possible to reduce a dishing effect in wider patterns. Further, the low dishing effect can reduce a total loss of the films in the CMP and reduce a buffing time. Moreover, the pattern topography can be improved, thereby improving a manufacturing yield.

It will be understood that not all advantages have been necessarily discussed herein, no particular advantage is required for all embodiments or examples, and other embodiments or examples may offer different advantages.

In accordance with one aspect of the present disclosure, in a method for manufacturing a semiconductor device, a dielectric layer is formed over a substrate. A first pattern and a second pattern are formed in the first interlayer dielectric layer. The first pattern has a width greater than a width of the second pattern. A first metal layer is formed in the first pattern and the second pattern. A second metal layer is formed in the first pattern. A planarization operation is performed on the first and second metal layers so that a first metal wiring by the first pattern and a second metal wiring by the second pattern are formed. A metal material of the first metal layer is different from a metal material of the second metal layer. The first metal wiring includes the first and second metal layers and the second metal wiring includes the first metal layer but does not include the second metal layer.

In accordance with another aspect of the present disclosure, a semiconductor device includes a first metal wiring and a second metal wiring, which are formed in an interlayer dielectric layer disposed over a substrate. The first metal wiring and the second metal wiring being disposed on a same wiring layer. The first metal wiring includes at least a first metal layer made of a first material and a second metal layer made of a second metal material disposed over the first metal layer. The second metal wiring includes a first metal layer made of the first metal material but does not include any metal layer made of the second metal material. The first metal material is different from the second metal material.

In accordance with another aspect of the present disclosure, a semiconductor device includes a first metal wiring and a second metal wiring, which are formed in an interlayer dielectric layer disposed over a substrate. The first metal wiring and the second metal wiring being disposed on a same wiring layer. The first metal wiring includes a layered structure having more than one conductive layer, and the second metal wiring includes a layered structure having one or more conductive layers. The layered structure of the first metal wiring is different from the layered structure of the second metal wiring.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
   forming a dielectric layer over a substrate;
   forming a first pattern and a second pattern in the first interlayer dielectric layer, the first pattern having a width greater than a width of the second pattern;
   forming a first metal layer in the first pattern and the second pattern;
   forming a second metal layer in the first pattern; and
   performing a planarization operation on the first and second metal layers so that a first metal wiring by the first pattern and a second metal wiring by the second pattern are formed, wherein:

a metal material of the first metal layer is different from a metal material of the second metal layer, the first metal wiring includes the first and second metal layers and the second metal wiring includes the first metal layer but does not include the second metal layer, and the metal material of the first metal layer includes at least one of Co, Ru and Ag.

2. The method of claim 1, further comprising, before forming the first metal layer, forming a third metal layer in the first and second patterns and over an upper surface of the dielectric layer.

3. The method of claim 1, wherein:
the metal material of the second metal layer includes one of Cu, Co, Al and Ag.

4. The method of claim 1, wherein:
the metal material of the first metal layer includes Co, and the metal material of the second metal layer includes Cu.

5. The method of claim 2, wherein the third metal layer includes one of TiN and TaN.

6. A method for manufacturing a semiconductor device, comprising:
forming a dielectric layer over a substrate;
forming a first pattern and a second pattern in the first interlayer dielectric layer, the first pattern having a width greater than a width of the second pattern;
forming a first metal layer in the first pattern and the second pattern;
forming a second metal layer in the first pattern; and
performing a planarization operation on the first and second metal layers so that a first metal wiring by the first pattern and a second metal wiring by the second pattern are formed, wherein:
a metal material of the first metal layer is different from a metal material of the second metal layer,
the first metal wiring includes the first and second metal layers and the second metal wiring includes the first metal layer but does not include the second metal layer, and
the planarization operation includes:
a first planarization operation, in which an etching rate for the second metal layer is higher than an etching rate for the first metal layer; and
a second planarization operation performed after the first planarization operation, in which the etching rate for the second metal layer is smaller than the etching rate for the first metal layer.

7. The method of claim 6, wherein the first planarization operation is performed such that the first metal layer is not exposed.

8. The method of claim 6, wherein:
the method further comprises, before forming the first metal layer, forming a third metal layer in the first and second patterns and over an upper surface of the dielectric layer, and
the second planarization operation uses the third metal layer disposed over the upper surface of the dielectric layer as an etching stopper.

9. The method of claim 8, wherein the planarization operation includes:
a third planarization operation performed after the second planarization operation,
wherein the third metal layer disposed over the upper surface of the dielectric layer is removed by the third planarization operation.

10. The method of claim 1, wherein the first pattern and the second pattern are recesses laterally extending in a plan view and used for metal wirings to electrically connect different elements located at laterally different positions.

11. The method of claim 1, wherein the first pattern and the second pattern are holes vertically extending in the dielectric layer and used for contact plugs connecting an upper layer element and a lower layer element.

12. The method of claim 1, further comprising performing a heat treatment at a temperature from 200° C. to 500° C. after the forming the first metal layer and before the forming the second metal layer.

13. The method of claim 1, further comprising performing a heat treatment at a temperature from 200° C. to 500° C. after the forming the second metal layer and before the planarization operation is performed.

14. A semiconductor device, comprising:
a first metal wiring and a second metal wiring, which are formed in a same interlayer dielectric layer disposed over a substrate, the first metal wiring and the second metal wiring being disposed on a same wiring layer disposed in the interlayer dielectric layer, wherein:
the first metal wiring includes at least a first metal layer made of a first material and a second metal layer made of a second metal material disposed over the first metal layer,
the second metal wiring includes a first metal layer made of the first metal material but does not include any metal layer made of the second metal material,
the first metal material is different from the second metal material, and
the metal material of the first metal layer includes at least one of one of Co, Ru and Ag.

15. The semiconductor device of claim 14, wherein:
the first metal wiring further includes a barrier metal layer made of a third metal material disposed under the first metal layer of the first metal wiring, and
the second metal wiring further includes a barrier metal layer made of the third metal material disposed under the first metal layer of the second metal wiring.

16. The semiconductor device of claim 14, wherein:
the second metal material includes one of Cu, Co, Al and Ag.

17. The semiconductor device of claim 14, wherein:
the metal material of the first metal layer includes Co, and the metal material of the second metal layer includes Cu.

18. The semiconductor device of claim 15, wherein the third metal material includes one of TiN and TaN.

19. A semiconductor device, comprising:
a first metal wiring and a second metal wiring, which are formed in an interlayer dielectric layer disposed over a substrate, the first metal wiring and the second metal wiring being disposed on a same wiring layer, wherein:
the first metal wiring includes a layered structure having more than one conductive layer,
the second metal wiring includes a layered structure having one or more conductive layers,
the layered structure of the first metal wiring is different from the layered structure of the second metal wiring, and
at least one of the more than one conductive layer of the first metal wiring includes at least one of Co, Ru and Ag.

20. The semiconductor device of claim 19, wherein:
a number of conductive layers in the first metal wring is greater than a number of conductive layers in the second metal wiring.

21. The semiconductor device of claim 19, wherein the metal material of the first metal layer includes Co.

22. The semiconductor device of claim 19, wherein a difference between the number of conductive layers in the first metal wring and the number of conductive layers in the second metal wiring is one.

23. The method of claim 6, wherein in the first planarization operation, the etching rate for the second metal layer is twice or more than the etching rate for the first metal layer.

24. The method of claim 6, wherein in the second planarization operation, the etching rate for the first metal layer is twice or more than the etching rate for the second metal layer.

25. The method of claim 6, wherein:
the metal material of the first metal layer includes Co, and
the metal material of the second metal layer includes Cu.

* * * * *